United States Patent

Kennan et al.

[11] Patent Number: 5,903,827
[45] Date of Patent: *May 11, 1999

[54] SINGLE BALANCED FREQUENCY DOWNCONVERTER FOR DIRECT BROADCAST SATELLITE TRANSMISSIONS AND HYBRID RING SIGNAL COMBINER

[75] Inventors: Wayne Kennan, Palo Alto; Edmar Camargo, San Jose, both of Calif.

[73] Assignee: Fujitsu Compound Semiconductor, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/575,719

[22] Filed: Dec. 20, 1995

Related U.S. Application Data

[60] Provisional application No. 60/000,959, Jul. 7, 1995.
[51] Int. Cl.$^6$ .................................................. H04B 1/26
[52] U.S. Cl. ........................ 455/326; 455/323; 455/327; 455/333; 333/120
[58] Field of Search .................................. 458/319, 323, 458/324, 325, 326, 327, 328, 333; 333/120; 330/255, 307; 455/313, 314; 327/105, 113, 355, 357, 359, 581; 257/287

[56] References Cited

U.S. PATENT DOCUMENTS

| | | |
|---|---|---|
| 3,772,599 | 11/1973 | Ernst et al. . |
| 3,950,703 | 4/1976 | Reindel . |
| 3,955,194 | 5/1976 | Chua ........................................ 333/120 |
| 4,008,438 | 2/1977 | Shinkawa et al. . |
| 4,031,472 | 6/1977 | Shinkawa et al. . |
| 4,193,036 | 3/1980 | Cerny, Jr et al. ........................ 455/327 |
| 4,249,263 | 2/1981 | Shinkawa et al. ....................... 455/327 |
| 4,254,381 | 3/1981 | Wheatley, Jr. .......................... 330/301 |
| 4,333,058 | 6/1982 | Hoover ................................... 330/255 |
| 4,355,421 | 10/1982 | Seely ...................................... 455/327 |
| 4,377,005 | 3/1983 | Marchand et al. ...................... 455/327 |

(List continued on next page.)

FOREIGN PATENT DOCUMENTS

| | | |
|---|---|---|
| 96110821 | 1/1997 | European Pat. Off. . |
| 63-227202 | 9/1988 | Japan ...................................... 333/120 |
| 3090905 | 12/1988 | Japan . |
| 1068004 | 3/1989 | Japan . |

OTHER PUBLICATIONS

Electronics Letters, vol. 11, No. 2, Jan. 23, 1975, Stevenage GB, pp. 47–48, XP002023687 H. Bex: "New Broadband Balun".
"A Miniaturized, Broadband MMIC Balanced Mixer Module"; T. Takenaka, T. Tokumitsu, Publication Date: Oct. 9, 1990; pp. 413–418.
"44 GHZ Monolithic HEMT Downconverter"; J. Berenz, M. LaCon, M. Aust; Technical Digest 1990; pp. 189–192.

*Primary Examiner*—Reinhard J. Eisenzopf
*Assistant Examiner*—Lester G. Kincaid
*Attorney, Agent, or Firm*—Christie, Parker & Hale, LLP

[57] ABSTRACT

A monolithic microwave integrated circuit (MMIC) semiconductor chip, for use with a hybrid coupler, in a frequency downconverter. The chip has a first input lead for receiving a first combined input signal from the coupler, a second input lead for receiving a second combined input signal from the coupler, and an output lead. Each input signal is a microwave signal combined with a further frequency signal, and one of the microwave and further frequency signals of the first combined signal is out of phase with one of the microwave and further frequency signals of the second combined signal. A single balanced mixer has a first single ended mixer for converting the first combined signal to a first intermediate frequency signal and a second single ended mixer for converting the second combined signal to a second intermediate frequency signal. An amplifier is coupled to the first and second mixers for forming an amplified unbalanced intermediate frequency (IF) signal at the output lead representative of the first and second intermediate frequency signals.

5 Claims, 5 Drawing Sheets

U.S. PATENT DOCUMENTS

| | | | |
|---|---|---|---|
| 4,419,635 | 12/1983 | Reindel | 333/116 |
| 4,420,839 | 12/1983 | Hogerheiden, Jr. | 455/327 |
| 4,603,435 | 7/1986 | Butler | 455/319 |
| 4,603,437 | 7/1986 | Dydyk et al. | 455/327 |
| 4,607,394 | 8/1986 | Nightingdale | 455/327 |
| 4,651,344 | 3/1987 | Hasegawa et al. | 455/325 |
| 4,654,887 | 3/1987 | Murphy et al. | 455/327 |
| 4,658,440 | 4/1987 | Pavio et al. | 455/325 |
| 4,691,376 | 9/1987 | Watanabe et al. | 455/131 |
| 4,705,967 | 11/1987 | Vasile | 307/304 |
| 4,768,000 | 8/1988 | Pavio, Jr. et al. | 332/170 |
| 4,811,426 | 3/1989 | Pergande | 455/327 |
| 4,864,644 | 9/1989 | Takahashi et al. | 455/326 |
| 4,876,744 | 10/1989 | Endo et al. | 455/326 |
| 4,896,374 | 1/1990 | Waugh et al. | 455/326 |
| 4,904,966 | 2/1990 | Rubin | 333/120 |
| 4,994,755 | 2/1991 | Titus et al. | 330/54 |
| 5,001,372 | 3/1991 | Nyqvist | 327/113 |
| 5,006,811 | 4/1991 | Kruger | 329/354 |
| 5,125,109 | 6/1992 | Geller et al. | 455/313 |
| 5,196,805 | 3/1993 | Beckwith et al. | 330/54 |
| 5,208,563 | 5/1993 | Russell et al. | 333/109 |
| 5,237,294 | 8/1993 | Roerderer et al. | 333/120 |
| 5,325,000 | 6/1994 | Birkeland et al. | 455/313 |
| 5,359,214 | 10/1994 | Kurtz et al. | 257/287 |

SINGLE BALANCED FREQUENCY DOWNCONVERTER FOR DIRECT BROADCAST SATELLITE TRANSMISSIONS AND HYBRID RING SIGNAL COMBINER

CROSS REFERENCE

This application claims priority under 35 U.S.C. § 119(e) of U.S. Provisional Application No. 60/000,959, filed Jul. 7, 1995.

FIELD OF THE INVENTION

The present invention relates to direct broadcast satellite receiver systems and more particularly to single balanced frequency downconverters using gallium arsenide (GaAs) monolithic microwave integrated circuits (MMICs) and hybrid ring signal combiners for low noise block (LNB) downconverters.

BACKGROUND OF THE INVENTION

LNB downconverters are widely used with direct broadcast satellite (DBS) television receivers for converting microwave signals to an intermediate frequency suitable for processing by an indoor tuner. The LNB downconverter is typically mounted on an antenna or satellite dish and enclosed in a weatherproof housing. The output is connected to an indoor tuner attached to a television or video cassette recorder (VCR).

The LNB downconverter typically includes a frequency downconverter mounted on a printed circuit board along with support circuitry, additional amplifier stages and filters to provide increased amplification and reduced front end noise. The frequency downconverter typically converts microwave frequencies in the range of 11 to 12 GHz to an intermediate frequency (IF) in the range of 1,000 to 2,000 MHz.

With the rapid development of GaAs MMIC technology, commercial GaAs MMIC frequency downconverters have become very feasible for LNB applications. This is because GaAs MMICs provide low cost, improved reliability, reproducibility, small size, low weight, broadband performance, circuit design flexibility and multifunctional performance on a single chip. Today, several companies are offering competitive devices built from GaAs technology to participate in the development of the large consumer market for direct broadcast satellite receivers. However, to remain competitive, manufacturers must come up with ways to reduce cost. Reduced costs can be achieved by the elimination of circuitry and the consequent reduction of the dice area.

One technique for reducing the input circuitry of the GaAs MMIC frequency downconverters, and thereby reduce the dice area, is to use gate pumped active field effect transistor (FET) mixers. The principal advantages of the gate pumped FET mixer over other types of active FET mixers is that it can provide lower noise figures and higher conversion gain. Based on the low noise performance of this device, the gate pumped FET mixer in conjunction with an IF amplifier chain can achieve comparable gain and noise figure without the RF pre-amplifiers and image rejection filters typically integrated on GaAs MMIC frequency downconverters.

Despite the above mentioned advantages of the gate pumped mixer, a significant drawback is that this topology offers no isolation between the microwave and local oscillator (LO) signal ports. One way to overcome this problem is to design a single balanced gate pumped mixer and separate the microwave signal from the LO signal with a 180° rat-race hybrid coupler. By using a hybrid coupler, 30 dB of isolation at the center frequency is typically achieved. The disadvantage of this approach, however, is that FET balanced mixers require a 180° output hybrid, such as a passive IF balun, which complicates the circuitry and may increase its size.

Accordingly, there is a current need for a GaAs MMIC single balanced frequency downconverter that does not require an output hybrid.

SUMMARY OF THE INVENTION

An embodiment of the invention is a monolithic microwave integrated circuit (MMIC) semiconductor chip, containing two active mixers for downconverting a microwave signal to a balanced IF signal. The MMIC chip is for use with a hybrid coupler comprising a frequency downconverter sub-system. The chip has a first input lead which receives from the coupler, an input signal comprising a microwave signal combined with a Local Oscillator (LO) signal. The combined signal is applied to the first active mixer and downconverted to a first IF output. The second input lead receives a second combined signal from the coupler, which is applied to the second mixer for downconverting to a second IF output, wherein either the microwave signal or LO signal is out of phase with that applied to the input of the first mixer. As a consequence, the two IF output signals are 180 degrees out of phase and said to be balanced. The balanced IF signals are amplified and converted to a single unbalanced IF signal at the output lead representative of the first and second IF signals.

An embodiment of the invention is also a monolithic microwave integrated circuit (MMIC) semiconductor chip, for use with a hybrid coupler, in a frequency downconverter. The chip has a first input lead for receiving a first combined input signal from the coupler, a second input lead for receiving a second combined input signal from the coupler, and an output lead. Each input signal is a microwave signal combined with a further frequency signal, and one of the microwave and further frequency signals of the first combined signal is out of phase with one of the microwave and further frequency signals of the second combined signal. A single balanced mixer has a first single ended mixer for converting the first combined signal to a first intermediate frequency signal and a second single ended mixer for converting the second combined signal to a second intermediate frequency signal. An amplifier is coupled to the first and second mixers for forming an amplified unbalanced intermediate frequency (IF) signal at the output lead representative of the first and second intermediate frequency signals.

In one embodiment the LO signal in the first combined signal to the first mixer has substantially the same phase and amplitude as the LO signal in the second combined signal to the second mixer.

Also in one embodiment the semiconductor chip includes a first low pass filter between the output of the first mixer and the IF amplifier for removing the microwave signal and the LO signal from the first intermediate frequency signal, and a second low pass filter between the output of the second mixer and the IF amplifier for removing the microwave signal and LO signal from the second intermediate frequency signal.

Preferably each IF of the first and second active mixers is a gallium arsenide (GaAs) field effect transistor (FET).

Also preferably, each GaAs FET is biased substantially at pinch off.

Further, each GaAs FET is preferably an enhancement mode FET.

Preferably the IF amplifier has one differential to single-ended amplifier producing from the first and second intermediate frequency signals the unbalanced intermediate frequency signal.

Preferably a passive hybrid coupler provides the first and second combined signals to the MMIC chip.

Preferably a rat-race hybrid coupler provides the first and second combined signals to the mixers. The rat race is preferably folded to allow connections to the chip to be made so as to reduce crossover interference and the risk of circuit instability.

An attractive feature of an embodiment of the present invention is that the GaAs dice area may be reduced by over 50% compared to conventional GaAs MMICs by eliminating the RF preamplifier and image rejection filter from the semiconductor chip. Since dice area is the main cost driver for this product it provides a significant advantage.

Another attractive feature of an embodiment of the invention is that the balanced microwave and IF signals provide virtual electrical ground points on the surface of the dice. This makes the performance of the device relatively insensitive to the parasitic ground inductance typically encountered in low cost surface mount plastic packages. In addition, only the active mixer operates at the microwave frequency and it is therefore possible to assemble this device into a low cost surface mount plastic package and achieve acceptable levels of performance. This advantage also reduces the cost of this product.

Also, reduced power consumption can be achieved over conventional GaAs MMIC devices as the gate pumped active FET mixer can be biased near pinch off and requires minimal DC current. This coupled with the removal of the RF preamplifier allows the present invention to operate with less than one half of the DC bias current required by conventional MMIC topologies.

Moreover, by eliminating the RF preamplifier and the image rejection filter, increased bandwidth can be achieved. only the input match to the active mixers must meet the bandwidth requirement. This is accomplished with simple matching circuitry that is well known in the art. Additionally, if the matching circuitry is external to the GaAs MMIC dice, the single balanced frequency downconverter can be operated at many different frequency bands, e.g. X-band, C-band, S-band, etc. In practice, two times the microwave signal bandwidth of conventional GaAs MMICs can be achieved.

An embodiment of the invention is also a hybrid ring signal combiner which has a ring conductor with a convex shaped portion and a concave shaped portion. First and second input leads are connected, respectively, to the convex portion and the concave portion, and first and second output leads are connected to the concave portion on an outer periphery of the ring. Each of the first and second input leads receives a different one of a high frequency signal and a low frequency signal. The first and second input and output leads are connected at spaced apart positions to and along the ring so that first and second signals are formed at the first and second output leads, respectively, with each of the first and second signals having a combination of the microwave and further frequency signals but with at least one of the microwave and further frequency signals of the first combined signal being out of phase with the same frequency signal of the other of the first and second combined signals. The convex portion avoids the need to place the chip inside the ring and pass the amplified IF signal from the chip over the ring, where undesired signal coupling may occur. It also allows the chip to be placed outside but close to the ring so that the leads connecting the ring to the chip can be made as short as possible.

Preferably the chip and hybrid ring signal combiner are mounted on a substrate such as a printed circuit board.

BRIEF DESCRIPTION OF THE DRAWINGS

These and other features, aspects, and advantages of the present inventions will become better understood with regard to the following description, appended claims, and accompanying drawings wherein:

DETAILED DESCRIPTION

Figure 1:
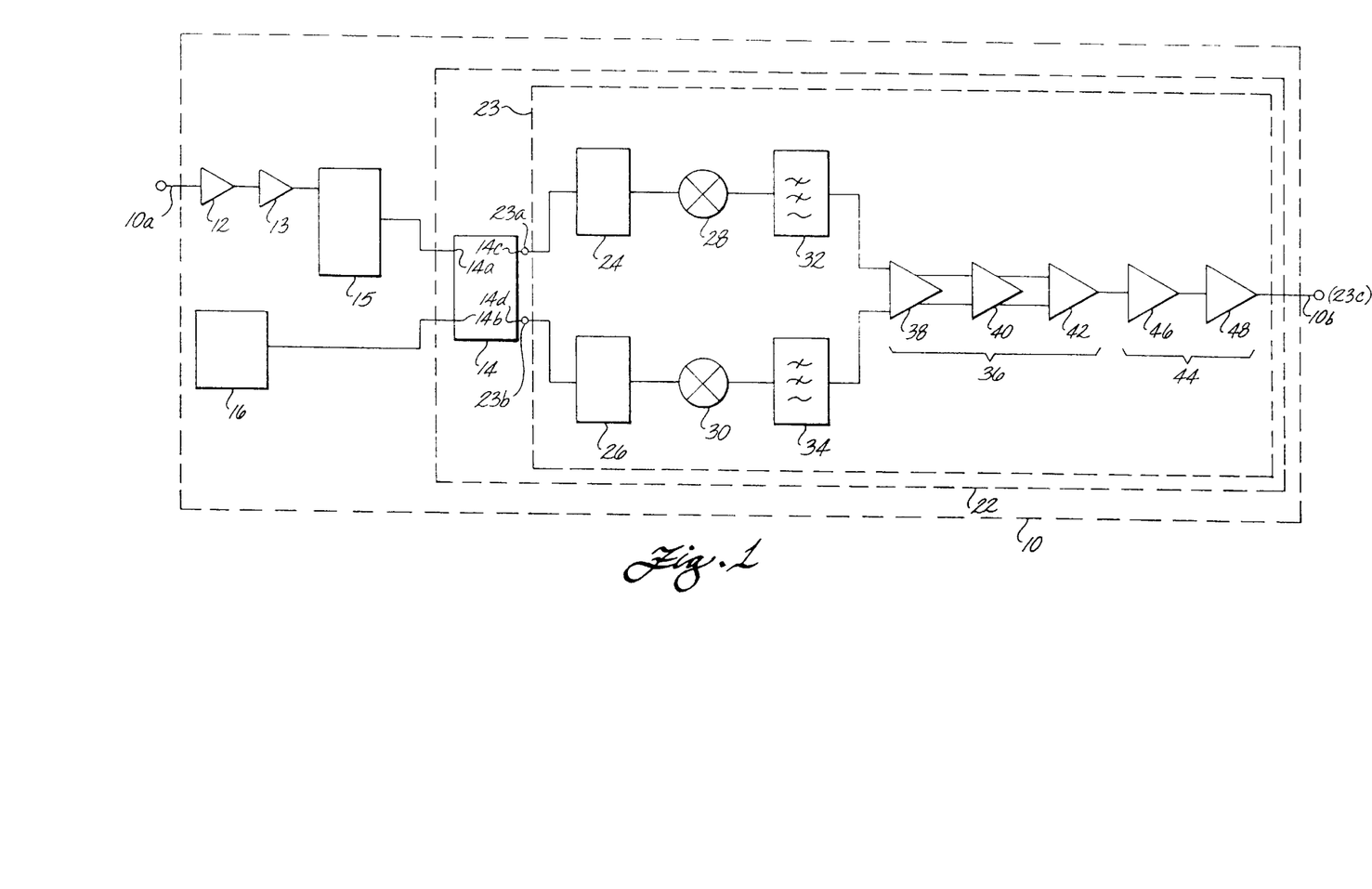
FIG. 1 is a functional block diagram of the LNB.

FIG. 1 depicts a functional block diagram of an LNB downconverter 10 for use in a DBS receiver system. The LNB downconverter 10 converts microwave signals to an intermediate frequency suitable for processing by an indoor tuner. Typically, the LNB downconverter 10 receives microwave signals in the range of 11 to 12 GHz from an antenna or satellite dish (not shown) at input 10a and downconverts these signals to an intermediate frequency (IF) at output port or lead 10b (also 23c) in the range of 1,000 to 2,000 MHz.

Two cascaded high electron mobility transistor (HEMT) based low noise amplifiers 12, 13 are positioned at the front end of the LNB downconverter 10 for receiving the microwave signal. These stages amplify the incoming signal and determine the signal-to-noise sensitivity of the receiver. The output of the low noise amplifier is fed to an image rejection filter 15 where image noise is rejected. The output of the image rejection filter 15, a microwave signal, is applied to input port or lead 14a of a hybrid coupler 14 where it is combined with further frequency signal commonly known as a local oscillator (LO) signal from oscillator 16. The LO signal is applied and received on input port or lead 14b. The hybrid coupler 14 splits and combines the incoming microwave and LO signals between two coupler output ports or leads 14c and 14d. Output ports or leads 14c and 14d are input to ports or leads 23a and 23b, respectively, of GaAs monolithic integrated circuit (MMIC) 23. A signal incident at hybrid coupler input port 14b will produce two equal amplitude in-phase components at two output ports 14c and 14d. A signal incident at the other input port 14a will produce two equal amplitude anti-phasal (or 180° out of phase) components at the two output ports 14c and 14d. It will be understood by one having ordinary skill in the art that it is also possible to operate the single balanced frequency downconverter with the opposite configuration, that is, with the microwave signal applied at the port which produces two in-phase components at the output ports and with the LO signal applied at the input port which produces two out of phase components at the output ports. Furthermore, it will be understood by one having ordinary skill in the art that the single balanced downconverter can also operate with a 90° phase shift hybrid coupler in place of the 180° phase shift hybrid coupler.

The hybrid coupler 14 is preferably a rat-race ring type coupler of the type to be disclosed which provides enhanced characteristics as will be discussed. However, other passive hybrid couplers may be used with the MMIC 23. Passive microwave hybrid couplers are microwave hybrids that use inactive circuit elements, such as resistors, inductors and capacitors, and are four-port devices having a special set of characteristics that can be defined as follows: (1) all ports are matched[1], (2) RF power applied to any one port is split equally between two of the other ports, and (3) the remaining port is isolated (i.e., no output is obtained from it). In a 180-deg hybrid the output voltages differ in phase by 0 deg or 180 deg, depending on which port is excited. In a 90-deg hybrid, the phases differ by 90 deg at the two outputs, regardless of which port is excited. Discussions of and examples of hybrid couplers are contained at pp. 238–255, section 7.1.2 of *Hybrid Couplers of Microwave Mixers*, Second Edition, Stephen A. Mass, copyright 1993, Artech House, Inc., Norwood, Mass.

[1] In the sense that $S_{nn}=0$ at each port. This is not necessarily a conjugate match to the source.

The transformer type hybrid coupler would be a good choice for applications where the input frequencies are below approximately 2000 Mhz. This coupler is relatively compact, has low loss, and is inexpensive. Above this frequency, however, the performance degrades rapidly.

For input frequencies much higher than 12 Ghz, it is desirable to include the hybrid coupler on the GaAs MMIC substrate because it is physically very small and there are no parasitics in connecting the hybrid to the active mixers. The monolithic hybrid could be realized in lumped element form with inductors and capacitors, or use other common couplers such as branchline, ratrace, or Lange. Implement of the ratrace hybrid on a GaAs substrate, because the physical size, is still prohibitively expensive at 12 GHz.

Referring to MMIC 23 of FIG. 1, impedance matching circuits 24 and 26 are connected to input ports or leads 23*a* and 23*b*, respectively, matching the input of gate pumped active FET mixers 28 and 30 to their respective source impedance of the hybrid coupler 14. The impedance matching circuits ensure that maximum power is transferred from the output of the hybrid coupler to the input of the FET mixers. The FET mixers 28 and 30 produce a spectrum of output frequencies including that of the microwave signals and of the LO signal, their sum and difference frequencies and harmonics thereof. Low pass filters 32 and 34 are connected to the output of FET mixers 28 and 30, respectively, for selecting the intermediate frequency signal, which is the difference frequency signal, and blocking the remaining frequency signals from an IF path through the MMIC 23. The low pass filters 32 and 34 provide a balanced intermediate frequency signal consisting of two anti-phasal IF signals to an amplifier 36, and amplifier 36 converts the balanced frequency signal into an unbalanced intermediate frequency signal at output port or lead 23*c*.

The amplifier 36 may be implemented by methods well known in the art, to optimize gain and noise figure performance while maintaining low dice area and complexity. Preferably, a cascaded circuit having two differential amplifier stages 38 and 40 feeding a differential to single-ended converter 42 is provided.

The unbalanced intermediate frequency output of the differential amplifier 36 (including amplifiers 38, 40 and 42) is coupled to IF amplifier 44 (including amplifiers 46 and 48) where it is further amplified. Amplifier 42 converts the two balanced intermediate frequency signals from mixers 32 and 34, and amplified by amplifiers 38 and 40, to an unbalanced signal for single-ended amplifiers 46 and 48. The amplified unbalanced intermediate frequency signal from amplifier 48 at output port 23*c*, is fed to an indoor tuner (not shown) for further processing.

Figure 2:
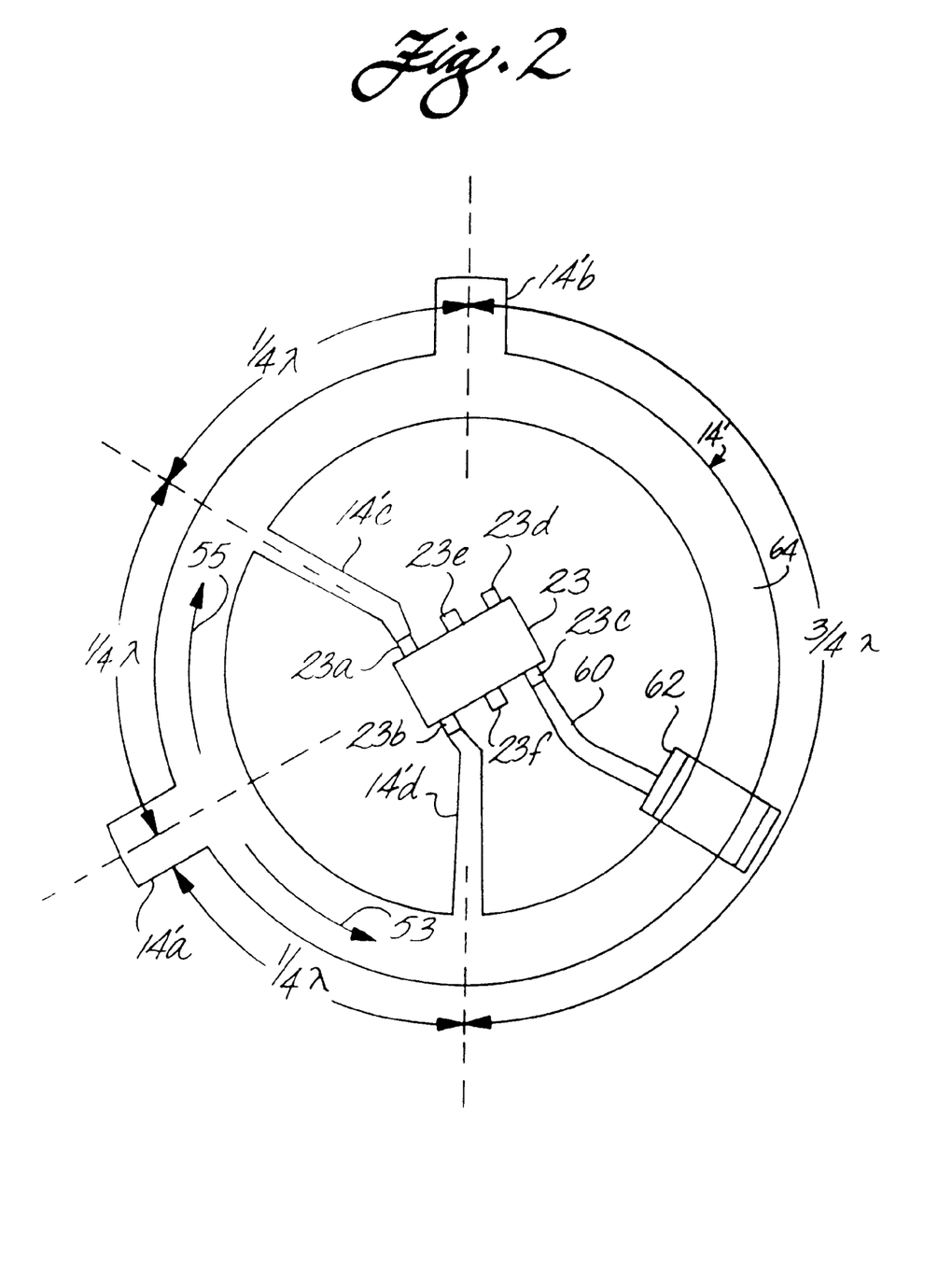
FIG. 2 is an illustration of a single balanced frequency downconverter with a conventional rat-race hybrid coupler.

FIG. 2 shows a 180° hybrid coupler 14', known in the art as a rat race. The rat race is a circular ring 3/2 wavelengths in circumference having four ports 14'*a*, 14'*b*, 14'*c* and 14'*d*. The same reference numerals are used for corresponding components of the coupler of FIG. 1 and the rat-race coupler of FIG. 2, with the addition of a prime (') for the rat race of FIG. 2. This configuration performs the required splitting and combining of the incoming microwave and LO signals and achieves excellent isolation between the two incoming signals. Isolation is important to minimize leakage of the LO signal out of the LNB antenna through the microwave signal path. It is achieved in the following manner: A LO signal fed into the LO input port 14'*a* splits equally into two paths consisting of a first path 53 in the counterclockwise direction and a second path 55 in the clockwise direction. The distance the signal must travel along the first path 53 to reach the microwave input port 14'*b* is 1 wavelength at the LO frequency. The distance the signal must travel along the second path 55 to reach the microwave input port 14'*b* is ½ wavelength at the LO frequency. Consequently, the two LO signals arrive at the microwave input port 14'*b* 180° out of phase and therefore cancel. The LO signal at ports 14'*c* and 14'*d* are equal in amplitude and in phase. The microwave signal at port 14'*b* is similarly split into two equal amplitude signals at ports 14'*c* and 14'*d* and 180° out of phase. The GaAs MMIC 23 downconverts the microwave signal to an unbalanced intermediate frequency and outputs it through a lead including port 23*c* and coupler 62 for processing by the indoor tuner (not shown). If the GaAs MMIC 23 is mounted inside the rat-race ring, the IF output signal at port 23*c* needs to cross over the rat-race ring at some point along portion 64 of the rat-race ring. The crossover produces coupling between the signals at port 23*c* and the rat-race ring and causes feedback between the input and output ports of the GaAs MMIC 23. If the gain of the GaAs MMIC is high, there is a strong possibility of undesired oscillations. Alternatively, installation of the GaAs MMIC outside the rat race 14' may avoid the feedback problem, but it enlarges the layout and presents complex layout problems.

A novel solution entails folding the rat race to allow repositioning of the chip relative to the rat-race and reconnection of the connecting leads to allow complete isolation of the output port 23*c* from the rat race and thereby eliminate the feedback loops.

Figure 3:
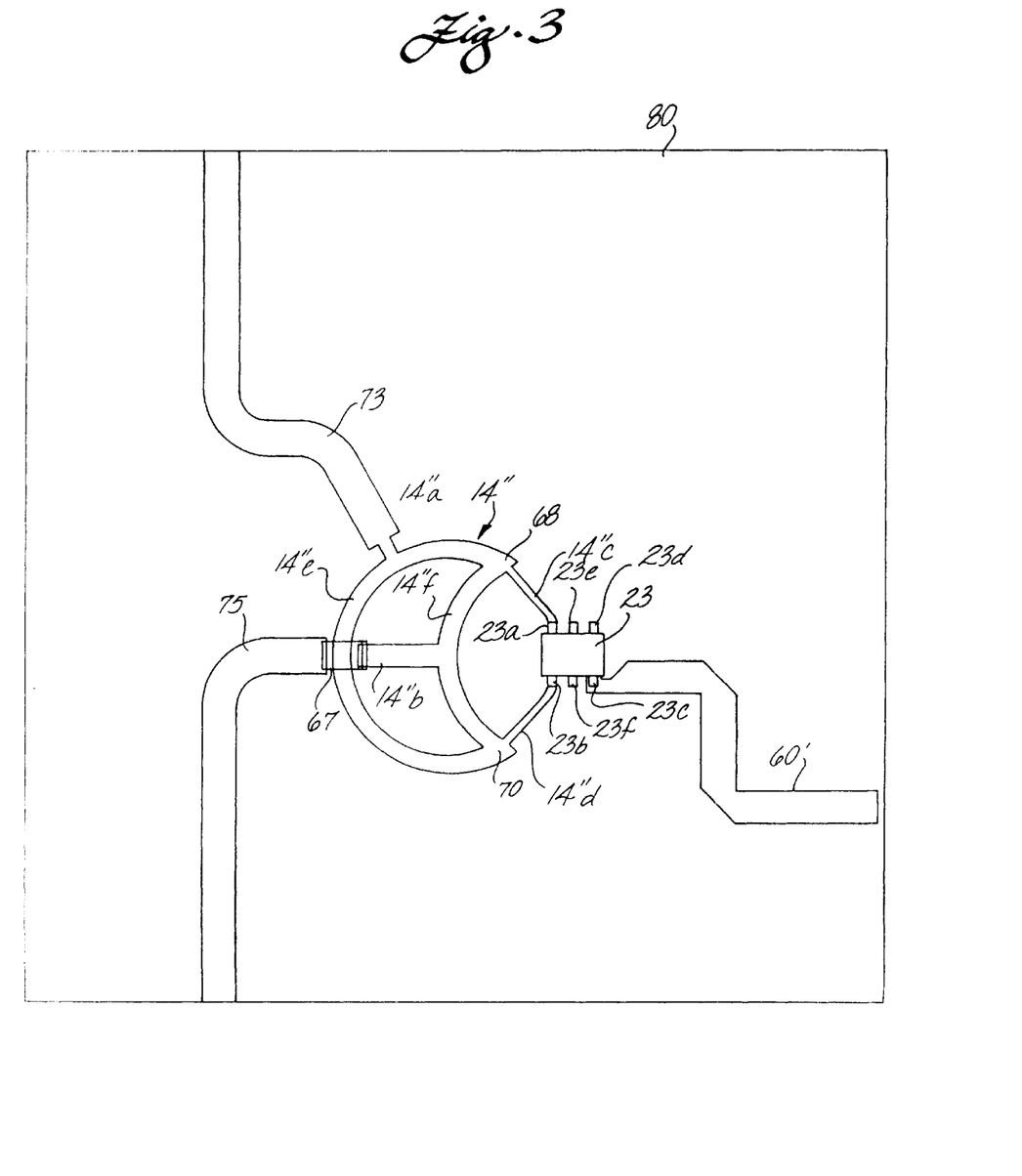
FIG. 3 is an illustration of a single balanced frequency downconverter with a folded rat-race hybrid coupler.

This approach is illustrated in FIG. 3. The same reference numerals are used in FIGS. 2 and 3 to identify corresponding components but double primes are used to identify the corresponding parts of FIG. 3. Here, a ½ wavelength section 14"*f* of circular ring 14" is folded back to form two arc portions, a concave arc portion 14"*f* of ½ wavelength which opposes a convex arc portion 14"*e* of 1 wavelength. LO input at the lead 75 including a coupler 67 and port 14"*b*, is routed over the 1 wavelength arc portion 14"*e* and is connected to the concave arc portion 14"*f* at its point of symmetry. The crossover 67 of the LO leading from conductor 75 can be accomplished with a metal ribbon, however, it is preferable to use a chip capacitor relative to arc portion 14"*e* to provide a DC current block. The microwave signal from the image rejection filter 15 is fed to the convex arc portion 141'*e* through lead 73 at port 14"*a*, ¼ wavelength from junction 68 in the concave arc portion 14"*f*. Balanced outputs are provided at junctions 68 and 70 where they are provided on leads including ports 14"*c* and 14"*d* leading to the GaAs MMIC 23. Rat race 14" is formed on a substrate such as circuit board 80. The chip 23 is mounted on the circuit board closely adjacent to the folded, convex arc portion 14″*f* to conserve space and minimize leads 14″*c* and 14″*d*.

The folded rat race does not alter any of the properties of the conventional circular ring shaped rat race and therefore will provide combined microwave and LO signals with the power divided equally between the two output ports. Additionally, the folded rat race will maintain excellent isolation between the LO and microwave signal.

The folding of the rat race introduces parasitic capacitance resulting from the abrupt bending of two ring lines at the junctions 68 and 70. This parasitic capacitance may be compensated for by adjusting the length of the leads of ports 14″*c* and 14″*d* connecting the rat race to the GaAs MMIC 23. In addition, the junction created by the fold-over reduces the total electrical length of the coupler and therefore must be compensated for by increasing the length dimensions of the arcs 14″*e* and 14″*f*.

Figure 4:
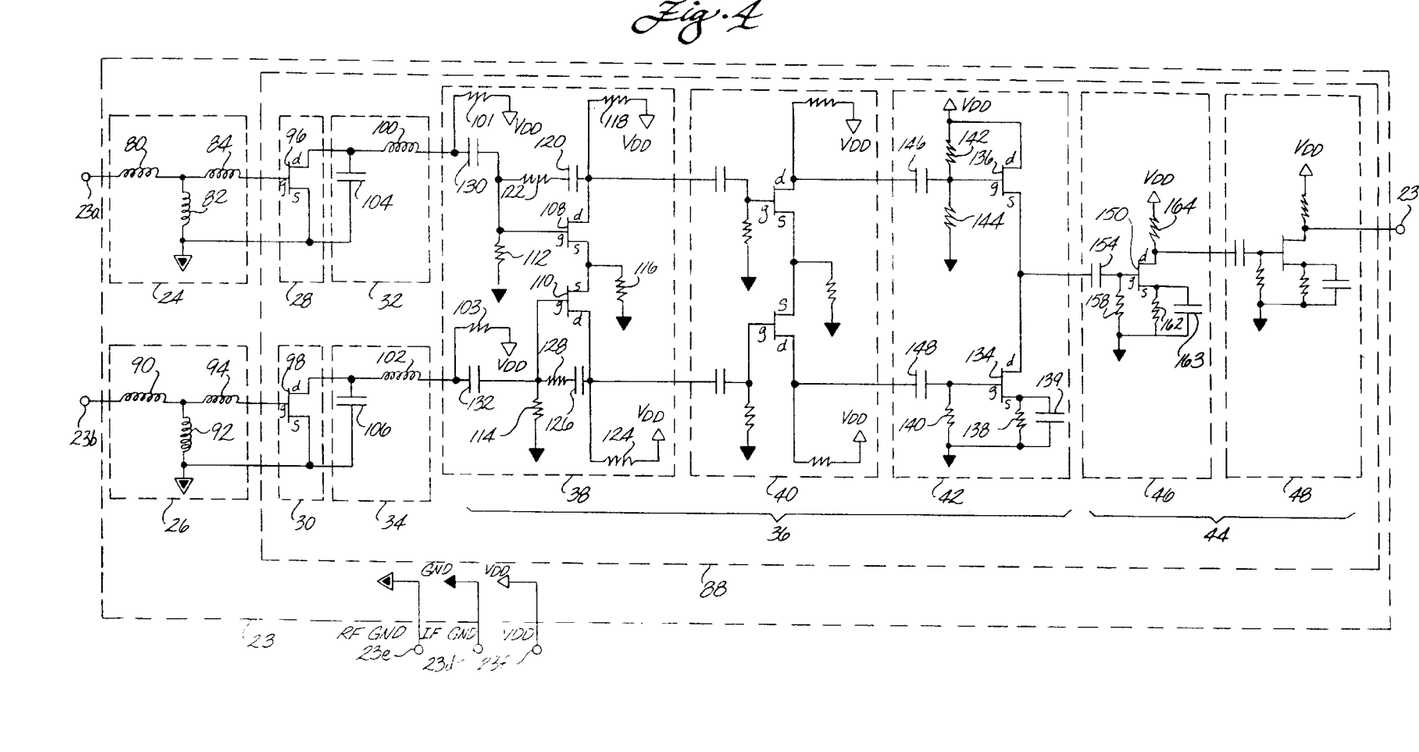
FIG. 4 is a detailed electrical schematic of the GaAs MMIC.

Turning to FIG. 4, a detailed electrical schematic of the GaAs MMIC 23 is provided. Impedance matching circuits 24 and 26 are provided at the input to the GaAs MMIC 23 for matching the gate pumped active FET mixers 96 and 98 to their respective source impedance of the hybrid coupler. The impedance matching circuits may be implemented by methods well known in the art, however, in the preferred embodiment, an inductive T-network is placed at the input to each FET mixer. Series inductors 80 and 84 and shunt inductor 82 form an impedance matching circuit for FET mixer 96. Similarly, series inductors 90 and 94 and shunt inductor 92 form an impedance matching network for FET mixer 98. The advantage of this approach is that inductors may be realized rather simply at the microwave and LO frequencies with mere bonding wires.

Figure 5:
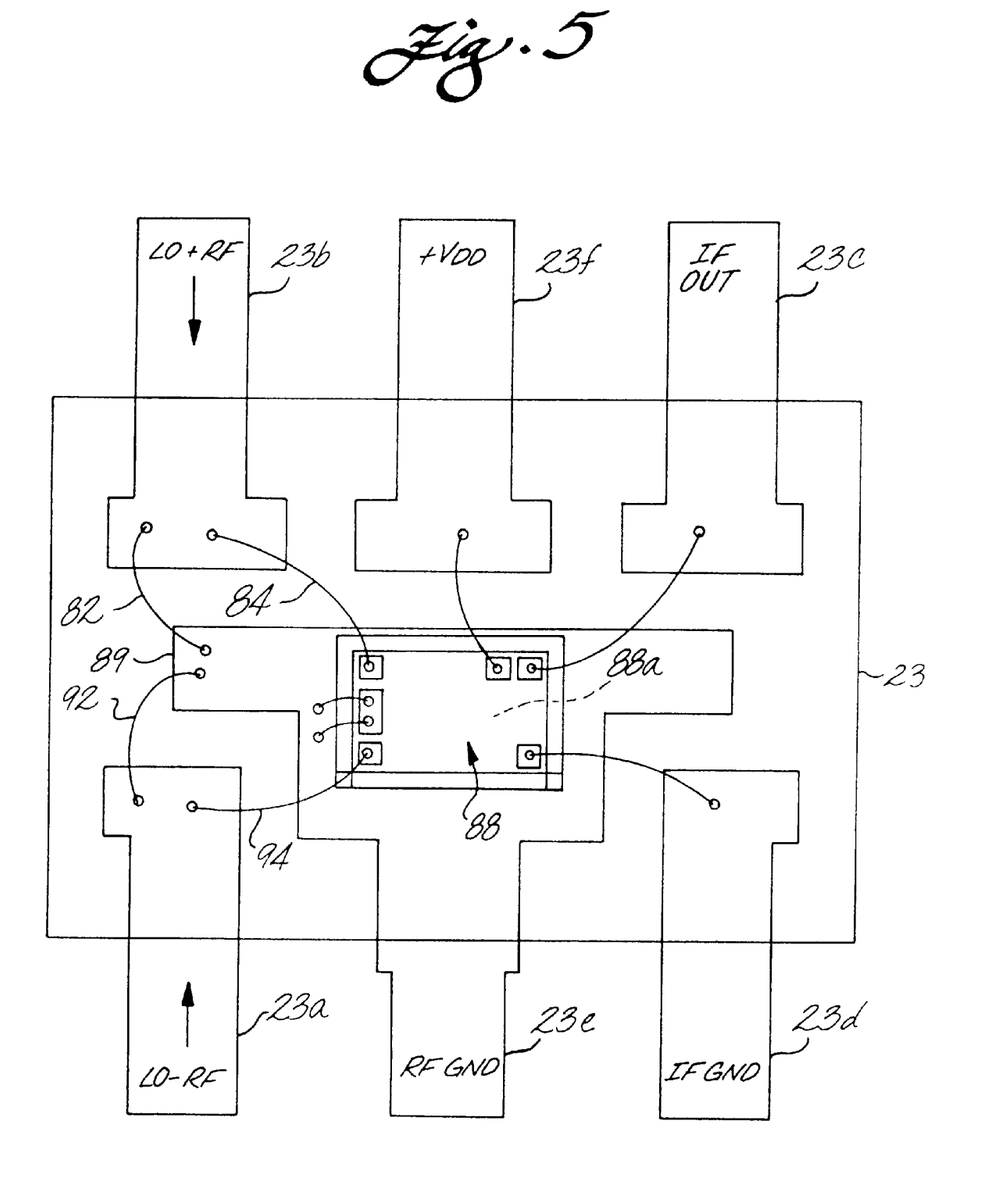
FIG. 5 is a cut-away top view of the GaAs MMIC in a surface mount plastic package.

Referring to FIG. 5, the inductive T-network is implemented external to dice 88 of GaAs MMIC 23 by using the inductance of input lead 23*b* in conjunction with a series inductance created with bonded wire 84 from chip 88 and a shunt inductance created with bonded wire 82 from input lead 23*b* to microwave ground plane and lead 23*e*. An identical circuit is implemented with leads 23*a*, 92, and 94 for the second input matching circuit. By positioning the inductive T-networks external to the dice 88, the MMIC 23 can be tuned for broadband applications.

Referring back to FIG. 4, single balanced mixer formed by single ended mixers 28 and 30 formed from active GaAs FET 96 and 98 mixers configured as gate or gate pumped mixers. Each mixer consists of a common source FET which is biased near pinch off to take advantage of the nonlinear characteristics of the FET. Preferably, an enhancement mode GaAs FET is used to provide pinched off operation with a 0 volt DC bias applied to the gate. This can be accomplished with shunt inductors 82 and 92 of the impedance matching circuits 24 and 26 respectively and thereby reduce the need for additional gate bias circuitry. The primary advantage of using a gate pumped active GaAs FET mixer is that low noise figure and high conversion gain can be achieved with a rather small chip area and therefore negates the necessity to have a front end RF preamplifier and image rejection filter in the GaAs MMIC 23.

With the gate pumped active GaAs FET mixers biased near pinch off, the combined LO and microwave signals are applied to the gate inputs of FET mixers 28 and 30. A spectrum of frequencies based upon the sum and difference of the microwave signal and the LO signal and their harmonics is produced at the drain of each FET mixer.

Low pass filters 32 and 34 are connected to the drain of FET mixers 96 and 98 respectively. Each low pass filter is implemented with a series inductor, 100 and 102 respectively, and a shunt capacitor, 104 and 106 respectively. The low pass filters are used to reject the microwave and LO signal components and pass the intermediate frequency, i.e. the difference frequency. For best performance, the filter components should be designed to present a short circuit to signals at the LO and microwave frequencies.

The two outputs of the low pass filters provide a balanced IF output comprising an IF signal and an inverted IF signal. The balanced IF output drives an amplifier 36 for amplifying and converting the balanced IF output to an unbalanced IF signal. Preferably, the amplifier 36 includes two differential amplifiers stages 38 and 40 and a differential to single-ended amplifier 42 in a cascaded circuit. The first stage differential amplifier 38 includes a common source depletion mode FET, 108 and 110, at each input. The gate of each FET is biased at ground through resistors 112 and 114 respectively. The sources are tied together and then tied to ground through a source resistor 116 providing a self-biasing network for both FET amplifiers. The self-biasing network results in a positive DC voltage at the source tie point sufficient to maintain a relative to the voltage on the source terminal negative bias of the gates of FETs 108 and 110 for optimum GaAs FET performance. The advantage of connecting the differential input in this symmetrical configuration is that a virtual ground is created at the source tie point of the two FETs which makes grounding parasitics much less harmful. Load resistors 118 and 124 connected between the power supply and the drains of FETs 108 and 110 respectively set the drain bias. In addition, each FET is provided with a feedback circuit to enhance the frequency response of the FET and to improve the input VSWR. FET 108 is provided with a feedback circuit comprising series capacitor 120 and resistor 122. FET 110 is provided with a feedback circuit comprising series capacitor 126 and resistor 128.

The balanced IF signals are applied to the gates of FETs 108 and 110 through DC blocking capacitors 130 and 132 respectively. The amplified balanced IF signals are output from the drains of the FETs and applied to a second stage differential amplifier 40 having the substantially identical circuitry as the first stage described above with the exception that the resistor and capacitor feedback circuit is not included.

The output of the second stage differential amplifier 40 is fed to a differential to single-ended amplifier 42. This amplifier consists of a common source FET 134 and a common drain FET 136. Similarly, to the differential amplifier 38 described above, the self-biasing resistor 138 results in a DC voltage at the source sufficient to maintain a negative bias of the gate of FET 134 relative to the voltage on the source terminal with the gate biased at 0 V through resistor 140. Capacitor 139 provides a short circuit to ground at the IF frequency. A voltage divider network comprising resistors 142 and 144 provides gate biasing for FET 136 for establishing a DC bias voltage at the gate.

The IF signal from the second differential amplifier stage 40 is applied to the gate of FET 136 through DC blocking capacitor 146. The output of the common drain FET 136 results in an amplified IF signal at the source. The inverted IF signal from the second differential amplifier stage 40 is applied to the gate of FET 134 through DC blocking capacitor 148. The output of the common source FET 134 results in a 180° phase shift of the inverted IF signal at the drain of FET 134 and therefore adds in phase with the IF signal at the source of FET 136 to produce an unbalanced IF signal.

The unbalanced IF signal may be applied to additional amplifier stages comprising IF amplifier stages 46 and 48. The first stage IF amplifier is comprised of FET 150 configured as a common source FET. FET 150 is provided with a DC blocking capacitor 154. The gate is biased at 0V through gate bias resistor 158 and the source voltage is set appropriately through self-biasing source resistor 162. Capacitor 163 provides a short circuit to ground at the IF frequency. Load resistor 164 connected between the power supply and the drain of FET 150 sets the drain bias. A second stage IF amplifier 48 configured identical to the first stage 46, and therefore is not described again, is optionally included for additional gain of the unbalanced IF signal.

Turning to FIG. 5, the MMIC 23 is fabricated from GaAs on dice 88 and assembled into a single plastic covered package (not shown) all of the circuit elements shown in FIG. 4 except for the input matching circuits 24 and 26 are formed on the dice 88 of chip 23 using conventional GaAs fabrication technology and techniques. Dice 88 is mounted on a ground plane provided by port or lead 23e. Leads 23a and 23b receive the combined balanced microwave and LO signals. Port or lead 23f receives the power supply input VDD, port or lead 23e is connected to the RF or microwave ground GND. Port or lead 23d is connected to IF ground GND. Port or lead 23c is the IF output. Separate IF ground 23d for amplifiers 36 and 44 and microwave ground 23e for circuits 24, 26, 28, 30, 32, and 34 are provided on the MMIC to minimize ground loops.

It is apparent from the foregoing that the present invention satisfies an immediate need for a low cost GaAs MMIC single balanced frequency downconverter for use in a LNB downconverter. The present invention provides low noise and high gain without the need for an RF preamplifier and image rejection filter at the input of the MMIC. The invention further provides a balanced system which can produce an intermediate frequency signal suitable for processing by an indoor tuner without the need for an IF hybrid coupler or balun. This single balanced frequency downconverter may be embodied in other specific forms and used with a variety of communication devices without departing from the spirit or essential attributes of the present invention. It is therefore desired that the present embodiment be considered in all respects as illustrative and not restrictive, reference being made to the appended claims rather than the foregoing description to indicate the scope of the invention.

What is claimed is:

1. A hybrid ring signal combiner comprising:
 a ring conductor comprising a convex shaped portion and a concave shaped portion, first and second input ports connected, respectively, to an outer periphery of the convex portion and to an inner periphery of the concave portion, said second input passing over the convex portion, and first and second output ports connected to the concave portion on an outer periphery of the ring, each of the first and second input ports receiving a different one of a microwave frequency signal and a further frequency signal, the first and second input ports being connected at spaced apart positions to and along the ring so that first and second combined signals are formed at the first and second output ports, respectively, with each of the first and second combined signals comprising a combination of the microwave and further frequency signals but with at least one of the microwave and further frequency signals of the first signal being out of phase with the same frequency signal of the other of said first and second combined signals.

2. A circuit for use in a frequency downconverter comprising:
 a passive hybrid coupler comprising first and second input leads each for receiving a different one of a microwave signal and a further frequency signal, and first and second output leads for outputting, respectively, first and second combined signals with each of the first and second combined signals comprising a combination of the microwave and further frequency signals but with at least one of the microwave and further frequency signals of one of the microwave and further signals being out of phase with the same at least one microwave and further frequency signal of the other of the first and second combined signals, said coupler comprising a convex shaped portion and a concave shaped portion, the first and second input leads connected, respectively, to the convex portion and the concave portion, said second input lead passing over the convex portion, and the first and second output leads connected to the concave portion on an outer periphery of the coupler, the first and second input and output leads each being connected at spaced apart positions to and along the coupler so that the first and second combined signals are formed at the first and second output leads, respectively; and
 a monolithic microwave integrated circuit semiconductor chip comprising,
 a first input port for receiving the first combined signal, a second input port for receiving the second combined signal, and an output port,
 a single balanced mixer comprising a first single ended mixer for converting the first combined signal to a first intermediate frequency signal, and a second single ended mixer for converting the second combined signal to a second intermediate frequency signal, and
 an amplifier for forming an amplified unbalanced intermediate frequency signal at the output port representative of said first and second intermediate frequency signals.

3. The frequency downconverter of claim 2 wherein the coupler and the chip are mounted on a common substrate and the chip is located adjacent the outer perimeter of the coupler.

4. The circuit of claim 2 wherein said amplifier comprises a first device having a first input coupled to an output of the first mixer, and a second active device having a second input coupled to an output of the second mixer, said first and second active devices each having an output connected together in common and coupled to the output port.

5. The circuit of claim 4 wherein the first and second active devices of the amplifier each comprises a field effect transistor, the first active device being arranged as a common drain device and the second active device being arranged as a common source device.

* * * * *

UNITED STATES PATENT AND TRADEMARK OFFICE
CERTIFICATE OF CORRECTION

PATENT NO. : 5,903,827
DATED : May 11, 1999
INVENTOR(S) : Wayne Kennan; Edmar Camargo It is certified that error appears in the above-identified patent and that said Letters Patent is hereby corrected as shown below:

Column 5, line 12, replace "180-deg" with -- 180° --.
Column 5, line 12, replace "0 deg" with -- 0° --.
Column 5, line 13, replace "180 deg." with -- 180° --.
Column 5, line 13, replace "90-deg" with -- 90° --.
Column 5, line 14, replace "90 deg" with -- 90° --.
Column 5, lines 32,33, replace "ratrace" with -- rat race -- (both occurrences).
Column 5, line 33, after "because" insert -- of --.
Column 6, line 44, replace "rat-race" with -- rat race --.
Column 6, line 63, replace "141'e" with -- 14"e --.
Column 6, line 63, replace "14a'''" with -- 14"a --.
Column 7, line 45, change "mixer" to -- mixers --.
Column 7, line 47, after "mixers" insert -- are --.

Signed and Sealed this

Nineteenth Day of December, 2000

Attest:

Q. TODD DICKINSON

*Attesting Officer*     *Commissioner of Patents and Trademarks*